United States Patent [19]
Watanabe et al.

[11] Patent Number: 5,792,985
[45] Date of Patent: Aug. 11, 1998

[54] TERMINAL FOR ELECTRONIC COMPONENT AND METHOD OF MANUFACTURING THE SAME

[75] Inventors: Hisashi Watanabe; Shoji Takeda; Hideki Notake, all of Okayama, Japan

[73] Assignee: Matsushita Electric Industrial Co., Ltd., Osaka, Japan

[21] Appl. No.: 700,942

[22] Filed: Aug. 21, 1996

[30] Foreign Application Priority Data

Aug. 25, 1995 [JP] Japan .................. 7-217244

[51] Int. Cl.$^6$ ................................. H01L 23/02
[52] U.S. Cl. .................. 174/52.5; 257/692; 257/693; 361/773
[58] Field of Search .................. 361/773, 776; 257/773, 775, 690, 692, 693, 694, 695, 696, 697; 29/874, 885; 174/52.5

[56] References Cited

U.S. PATENT DOCUMENTS

| | | | |
|---|---|---|---|
| 4,774,763 | 10/1988 | Palecek et al. | 29/874 |
| 4,949,223 | 8/1990 | Achiwa | 361/408 |
| 5,109,319 | 4/1992 | Potash | 361/405 |
| 5,264,672 | 11/1993 | Ishii et al. | 200/275 |
| 5,373,099 | 12/1994 | Boitard et al. | 174/16.3 |
| 5,398,773 | 3/1995 | Baker | 173/90 |
| 5,508,563 | 4/1996 | Tazawa et al. | 257/773 |

*Primary Examiner*—Bot L. Ledynh
*Assistant Examiner*—Hung V. Ngo
*Attorney, Agent, or Firm*—McDermott, Will & Emery

[57] ABSTRACT

A terminal for an electronic component having a connecting section with a rectangular shaped cross sectional for connection to the casing of the electronic component, and a taping section also with a rectangular shaped cross sectional for attachment to a tape carrying a plurality of such terminals. In between the connecting section and the taping section are a lower rod section and an upper rod section. The lower rod section facilitates the separation of the taping section from the tape. The upper section facilitates the separation of the connecting section from the remaining portion of the terminal.

9 Claims, 9 Drawing Sheets

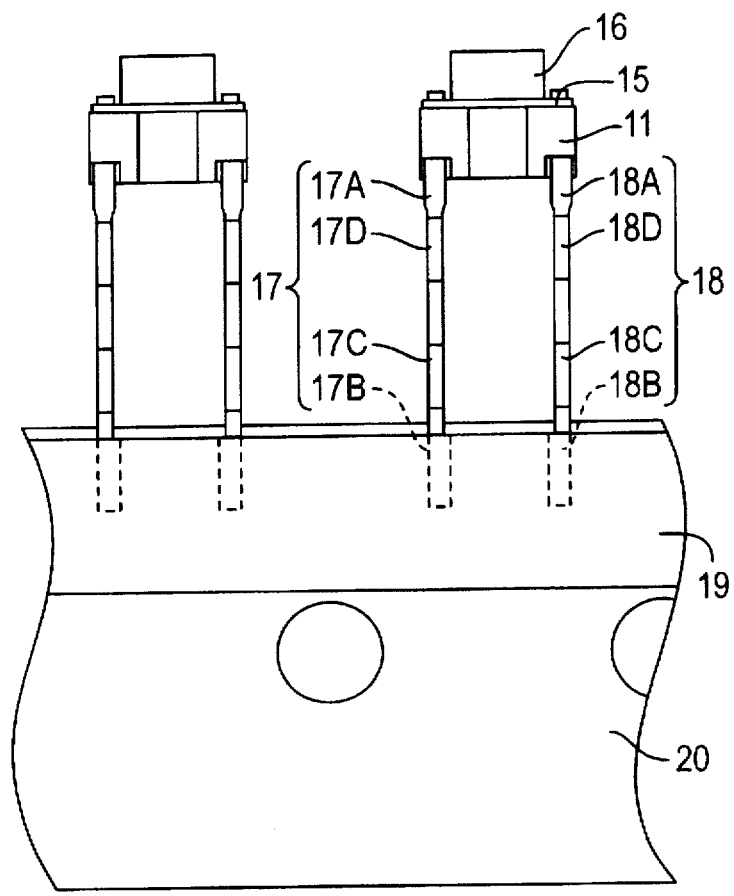
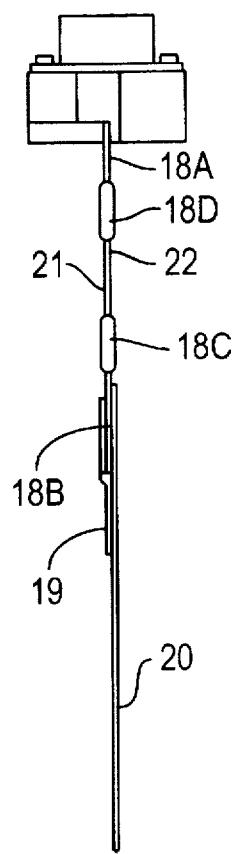
FIG. 1(a)
FIG. 1(b)

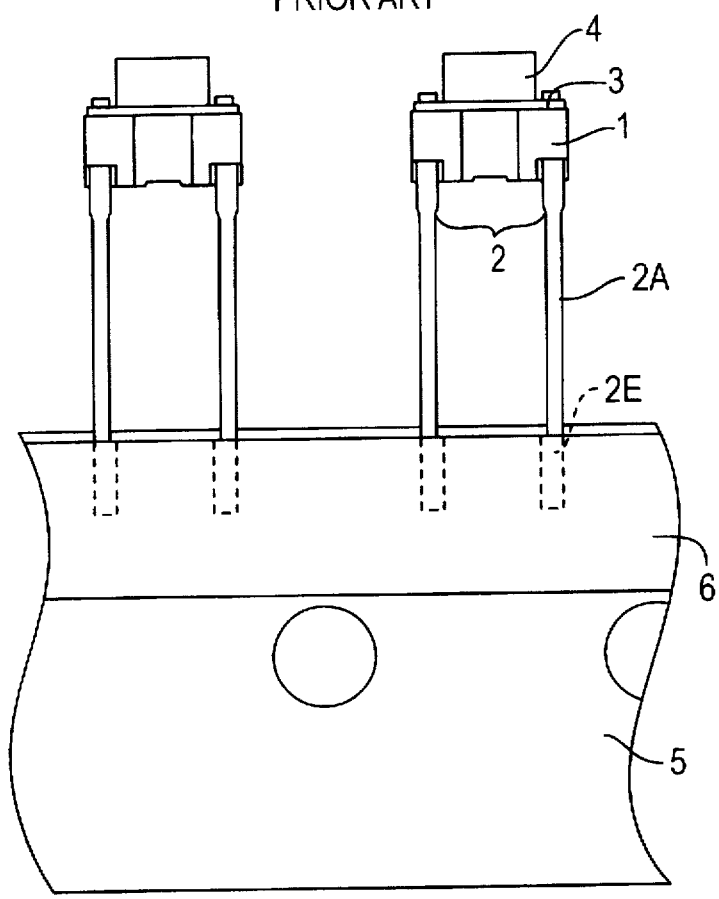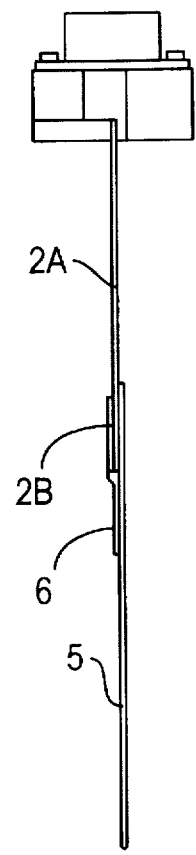

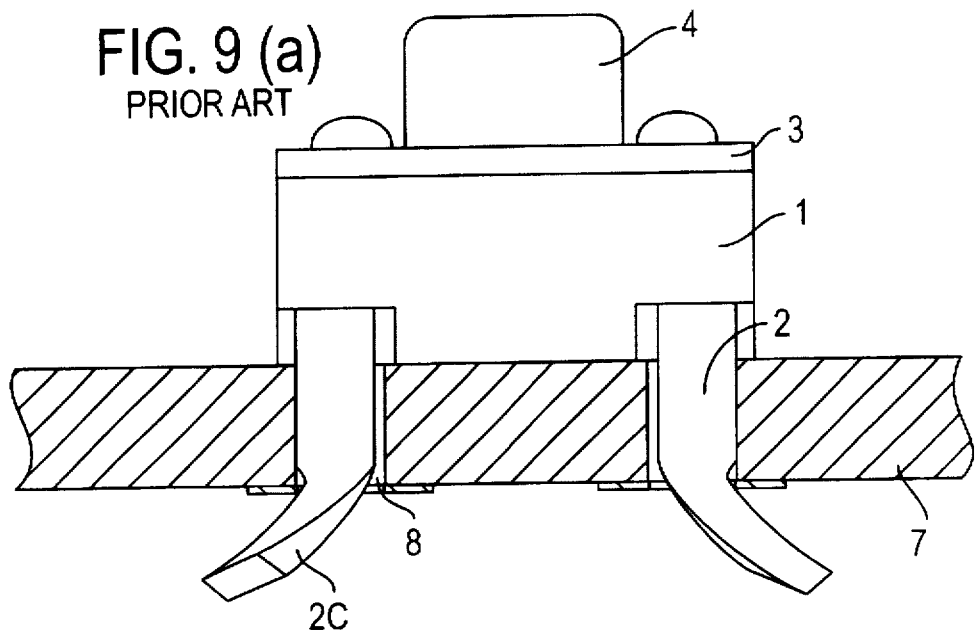
FIG. 9 (a) PRIOR ART
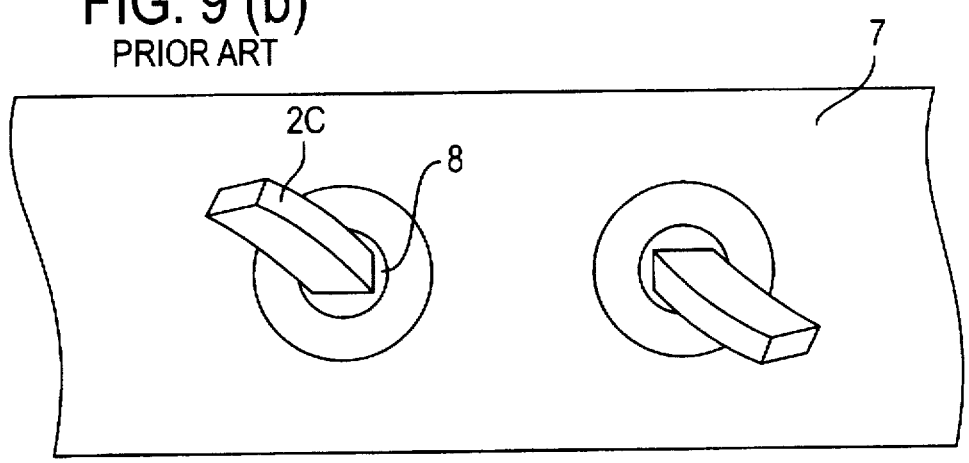
FIG. 9 (b) PRIOR ART

TERMINAL FOR ELECTRONIC COMPONENT AND METHOD OF MANUFACTURING THE SAME

BACKGROUND OF THE INVENTION

The present invention relates to a terminal which being a constituent part of an electronic component to be built in various electronic apparatus, and method of manufacturing the same.

In an increasing number of the recent electronic components, terminals are provided in the casing of component body itself by means of an insert-forming method. When it comes to a switch, variable resistor or other electronic component which is expected to be subject to mechanical manipulations by the external force after being mounted onto a printed circuit board of an apparatus, the mounting strength must be rigid enough to withstand a manipulating force; hence, such components are requested to be equipped with insertion type terminals which penetrate through a hole provided in advance in a circuit board.

Description is made in the following using a terminal of a push button switch suitable to automatic mounting, as the representative of prior art terminals.

In FIG.8(a) is a front view of the push button switches comprising prior art terminals, (b) a side view. The push button switch comprises two fixed contact points and one movable contact point within a molded resin casing 1. Pulled out of the casing 1 at the bottom are two sheet form terminals 2, which share the fixed contact points in one single member and are folded downward. The sheet form terminals 2 are manufactured through stamping of a metal sheet plated at both surfaces. On the top of the casing 1 is a cover 3 having an opening, in which opening a push button 4 is disposed for actuating the movable contact point. The sheet form terminals 2 are fixed in the casing 1 during molding by means of an insert-forming method. These complted push button switches are disposed on a tape 5 with a sticking tape 6 at the end 2B of a straight section 2A of the sheet form terminal 2, and then delivered to customers.

Push button switches delivered in the above state are loaded on an automatic mounting machine for insertion to a printed circuit board. In order to separate the push button switches from the tape 5, the sheet form terminals 2 are cut at the straight section 2A by cutting device for a certain length, and then the sheet form terminals 2 are inserted to respective holes 8 of printed circuit board 7 and bent at the end part 2C for preventing from the withdrawal, as illustrated in FIG.9(a) a side view of a prior art switch mounted on circuit board and FIG.9(b) a bottom view. The sheet form terminals 2 are soldered and then unnecessary parts are cut off. In some cases, the terminals are soldered after cutting.

The electronic component terminals manufactured of a metal sheet through stamping process have a rectangle shape in the cross section, which means that there is a great resistance at the cutting work. This brings about an early wear at a specific area in the edge of cutting knife, necessitating frequent replacing of the knife. Further, due to the rectangle shape in the cross section of the terminals, the terminals after cutting are not always standing uniform in a specified arrangement. In a case where the terminals are manufactured with a plated metal sheet, the sectional surfaces produced at the stamping and the cutting are not provided with a plated layer, therefore the wetting property at soldering is unsatisfactory.

SUMMARY OF THE INVENTION

The present invention is intended to present an easy-to-cut terminal for electronic components, as well as a method of manufacturing the same. Another objective of the present invention is to present a terminal for electronic components having a superior solder wetting property, as well as a method of manufacturing the same.

An electronic component terminal according to the present invention comprises a terminal body having a connecting section at one end for connection with electronic component and a taping section at the other end to be held by tape, wherein a different shape is provided between the connecting section and the taping section, the cross sectional shape at the different shape section is either a round, an oval or a polygon having more sides than the rectangle, while that of the connecting and taping sections is rectangle.

A method of manufacturing an electronic component terminal according to the present invention comprises a process of stamping a terminal body out of a flat sheet, the cross sectional shape of which terminal body is rectangle, and a process of forming said different shape section between said connecting section and taping section.

According to the present invention, an electronic component is mounted on a printed circuit board with the terminals bent and cut at the different shape section whose cross sectional shape is a round, an oval or a polygon having more sides than the rectangle. Therefore, the touching of the terminals against a cutting knife edge turns out to be mild, which substantially reduces the wear of knife edge. The terminals are bent also at the different shape section, therefore the terminals can be bent uniform at any specifided direction. In addition, even in a case where the terminals are made of a surface-plated metal sheet, the circumferential surface of the different shape section to be soldered with printed circuit board is covered with the plated layer, which wets well with the solder ensuring firm fixing of the terminal to the circuit board.

BRIEF DESCRIPTION OF THE DRAWINGS

FIG.1(a) shows a front view of push button switches comprising exemplary electronic component terminals according to the present invention.(b) a side view.

FIG. 8 (a) shows a front view of push button switches comprising prior art electronic component terminals, (b) a side view.

FIG. 9 (a) is a front view of the push button switch of FIG.8(a) mounted on a printed circuit board, (b) a bottom view.

DESCRIPTION OF THE PREFERRED EMBODIMENTS

Using a push button switch as the vehicle, a case where an electronic component terminal according to an embodiment of the present invention is used in an electronic component will be described in the following.

Figure 2:
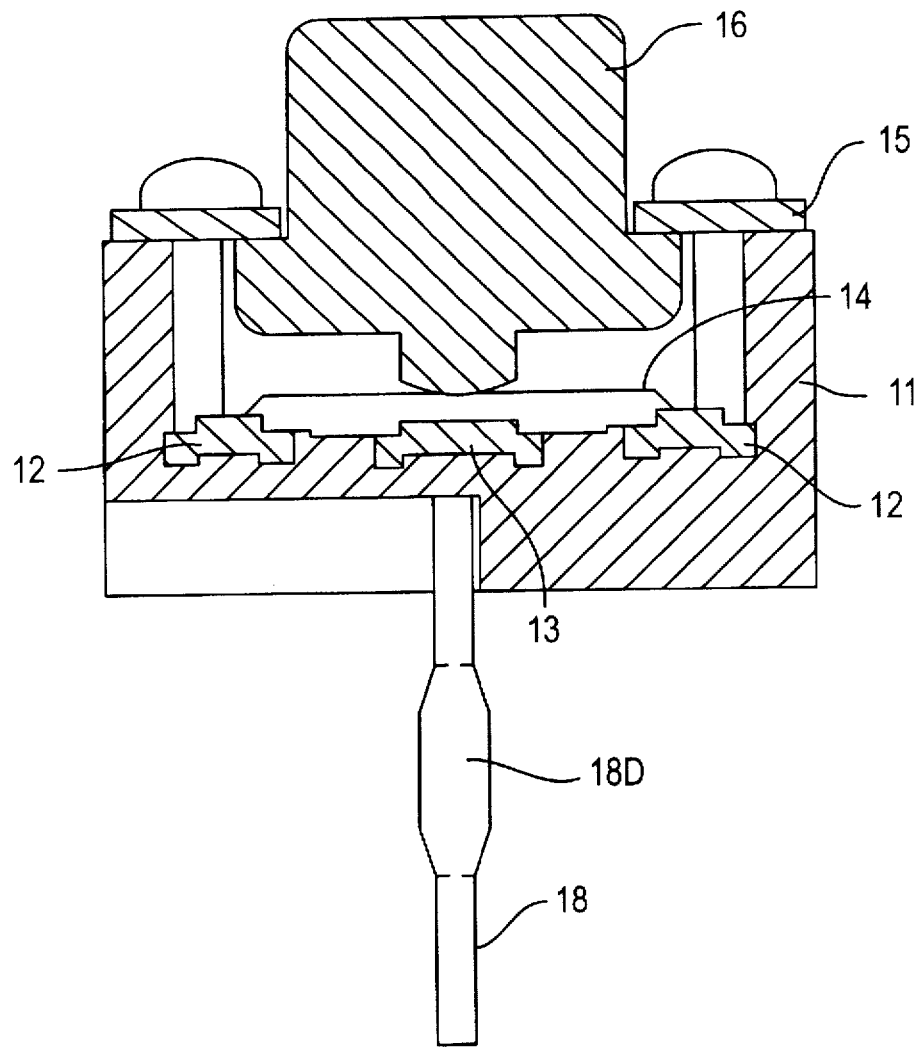
FIG.2 is a cross sectional view of the push button switch of FIG.1(a).

As shown in FIG.1(a), FIG.1(b) and FIG.2, the push button switch comprises two fixed contact points 12 and 13, and a movable contact point 14 within a resin-molded casing 11. On the top of the casing 11 is a cover 15 fixed by caulking having an opening. In the opening of cover, a push button 16 is disposed for actuating the movable contact point 14. From the bottom of casing 11, two terminals 17 and 18, each sharing respective fixed contact points 12 and 13 in a single body, are taken out bent downward respectively at the connecting sections 17A and 18A having rectangle cross section. The switches are attached to a tape 20 with an adhesive tape 19 at the broadened taping sections 17B and 18B of terminals 17 and 18. Each of the terminals 17 and 18 has a lower rod section 17C/18C and an upper rod section 17D/18D between the connecting section 17A/18A and the taping section 17B/18B. The push button switches are separated from the tape 20 by cutting at the lower rod section 17C/18C. After the switches are mounted on a printed circuit board, unnecessary part of the terminals are cut off at the upper rod section 17D/18D.

Figure 3:
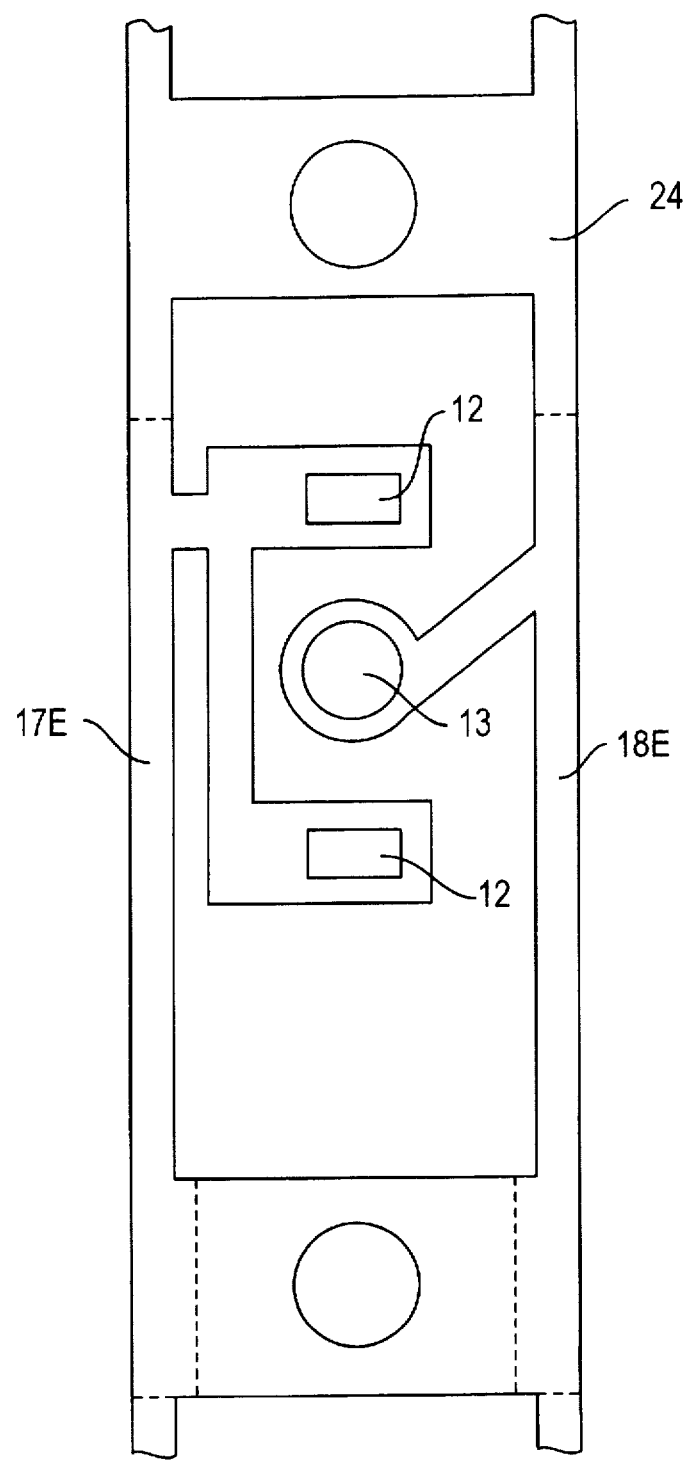
FIG.3 is a cross sectional view showing how the electronic component terminal of FIG.1(a) is manufactured.

The push button switch is manufactured through the following process steps. First, as shown in FIG.3, fixed contact points 12 and 13 and terminals 17E and 18E in their original form are stamped in a frame 24 out of a metal sheet strip, with the terminals 17E/18E constituting a part of the frame of the strip. The metal sheet is plated with silver at the both surfaces, layers 21 and 22, to ensure better contact between the fixed contact points 12/13 and the movable contact point 14, as well as for good wetting with the solder. Next, the frame 24 shown in FIG.3 is placed in a metal mold(not shown) in order to have the fixed contact points 12/13 and the terminals 17/18 insert-formed in the casing 11. By injecting resin into the metal mold, a casing 11 is manufactured, in which the fixed contact points 12/13 and the original form terminals 17E/18E are contained. Then, the metal strip is cut at the dotted lines in FIG.3, and the original form terminals 17E/18E are bent downward at the bottom of the casing 11.

Figure 4A:
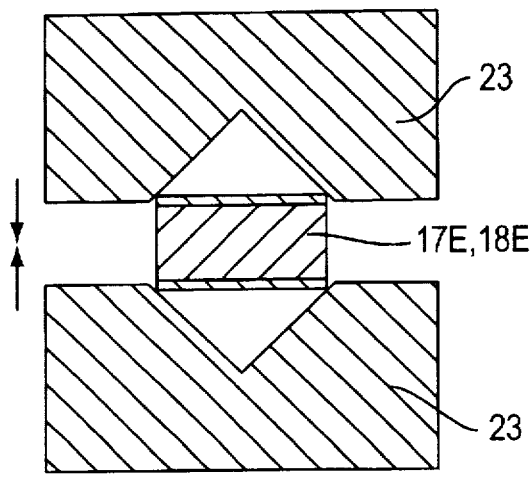
FIG.4(a), FIG.4(b) and FIG.4(c) are plane views showing how the electronic component terminal of FIG.1(a) is formed.

And then, as shown in FIG.4(a), the original form terminals 17E/18E having rectangle cross section are clamped with a pair of metal molds 23 having V-shape groove at specified places in order to have the lower rod sections 17C/18C and the upper rod sections 17D/18D formed.

Figure 4B:
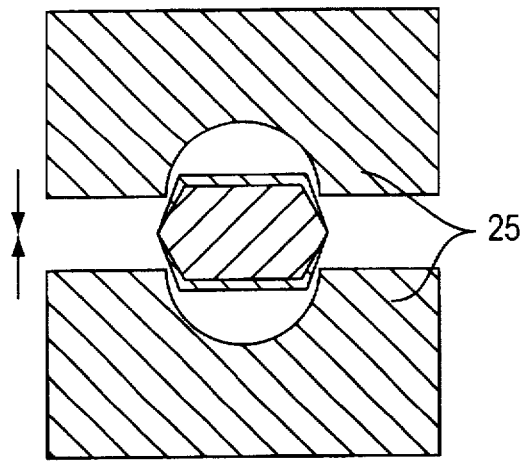
Figure 4C:
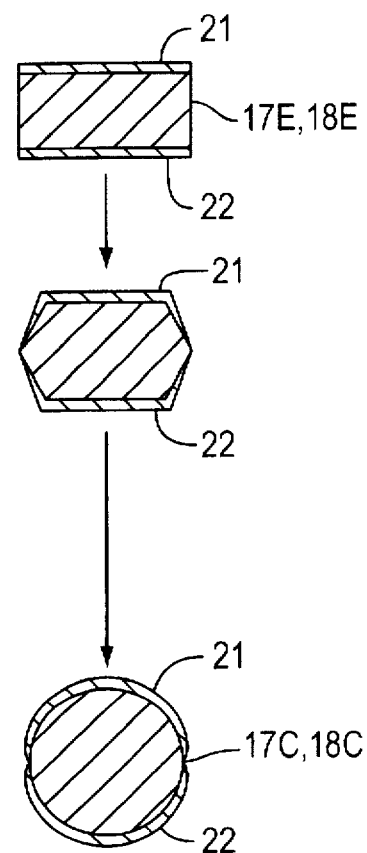
Figure 5:
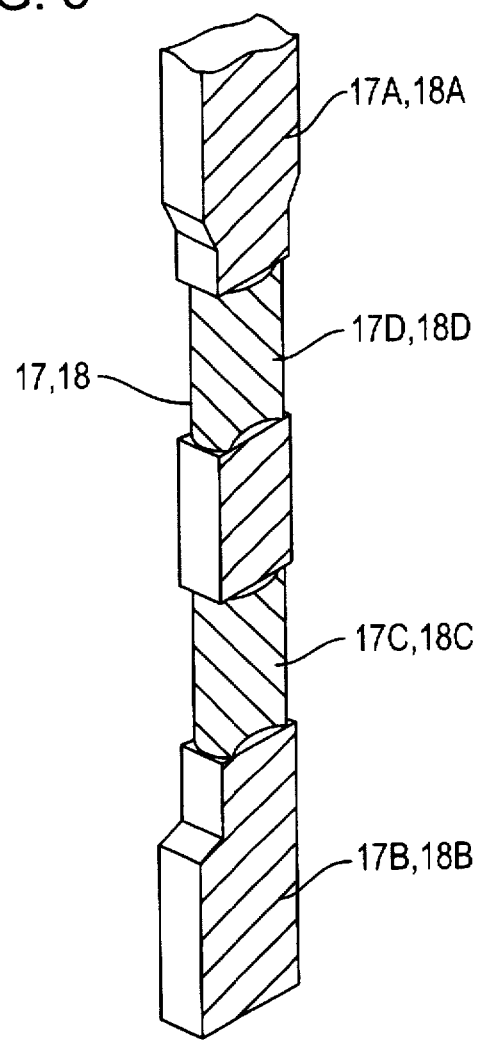
FIG.5 is a perspective view of the electronic component terminal of FIG.1(a).

The cross sectional shape at specified places of the original form terminals 17E and 18E is changed from the rectangle to approximately hexagonal shape by the above described forming procedure. The hexagonal shaped sections further undergo an additional forming procedure under a couple of matal molds 25 having semi-circle groove, as shown in FIG.4(b). Through this forming procedure, the approximately hexagonal cross sectional shape becomes circular, completing the lower rod sections 17C/18C and the upper rod sections 17D/18D. During the two forming procedures, the plated layers 21 and 22 on the both surfaces of the original form terminals 17E/18E are elongated to ultimately cover the entire surfaces of the lower and upper rod sections, as illustrated in FIG.4(c). FIG.5 shows a terminal 17/18 manufactured through the above described procedures; wherein the areas designated with slant lines are those covered with the plated layers 21 and 22.

And then, the movable contact point 14 and the push button 14 are assembled into the casing 11, and fixed with cover 15. Terminals 17/18 are fixed at the taping sections 17B/18B to a tape 20 using an adhesive tape 19. Push button switches are delivered to customers in the above arrangement.

Figure 6:
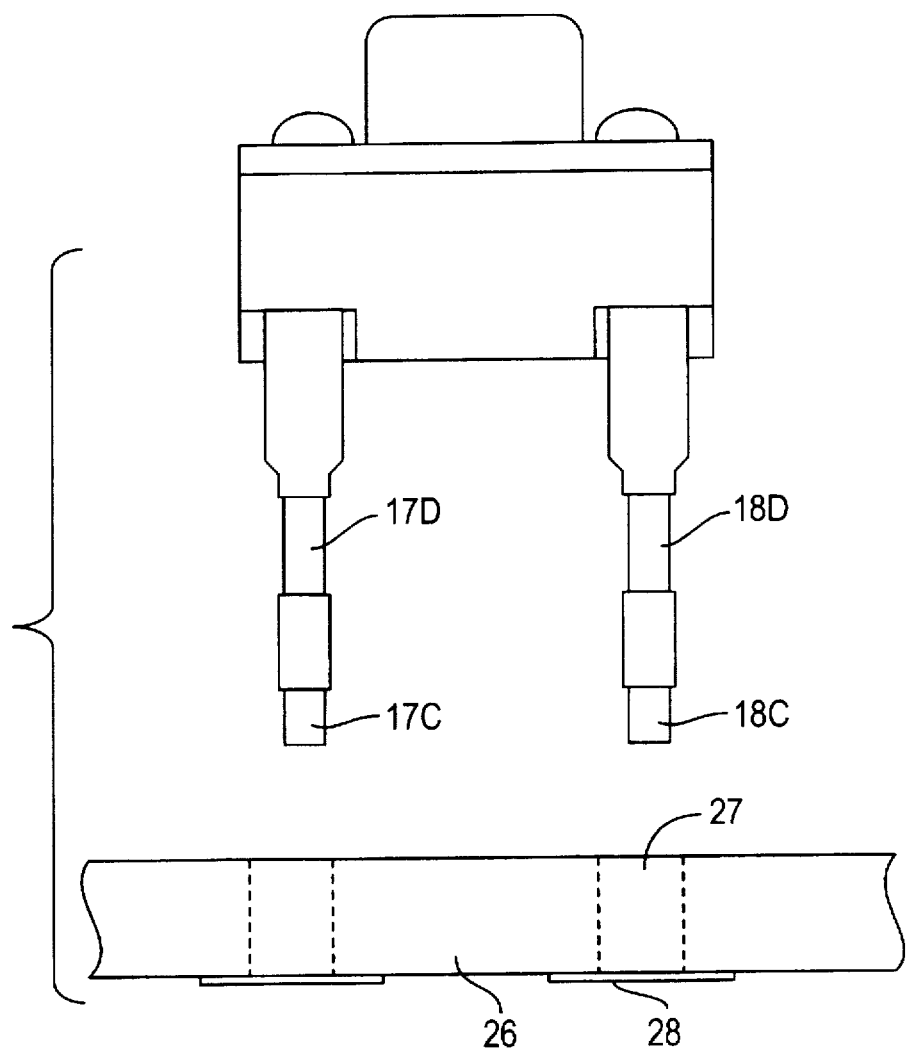
FIG.6 is a front view of the electronic component terminal of FIG.1(a) after separation by cutting.
Figure 7:
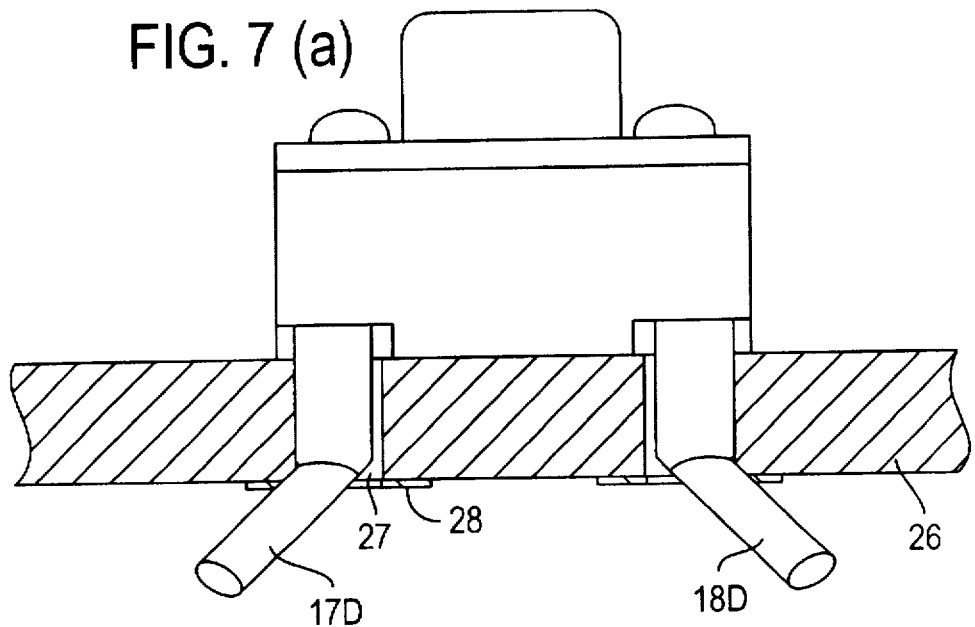
FIG. 7 (a) is a front view of the push button switch of FIG.1(a) mounted on a printed circuit board, (b) a bottom view.
Figure 7:
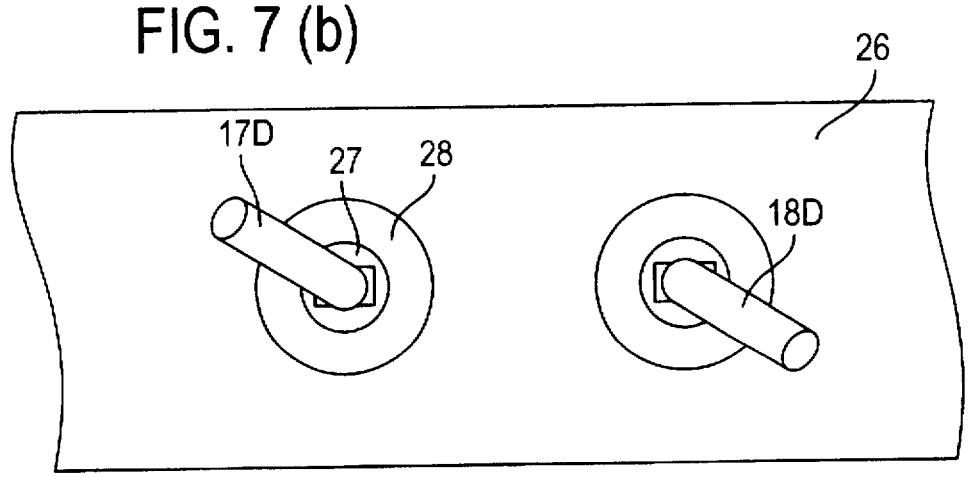

At the customers, a number of push button switches delivered in tape 20 is loaded on an automatic mounting machine to be attached to a printed circuit board 26. When, in order to have the switches separated from the tape 20 the terminals 17/18 are cut at the lower rod section 17C/18C, as shown in FIG.6. And the terminal 17/18 is put into a hole 27 of the printed circuit board 27 using the lower rod section 17C/18C as guide. Then, as illustrated in FIG.7(a) and FIG.7(b), the terminals 17/18 are bent to a specified direction in the upper rod section 17D/18D at a vicinity to the connecting section 17A/18A, to prevent withdrawal from the hole 27. The terminal 17/18 is soldered, after unnecessary portion is cut off at the upper rod section 17D/18D, with a land 28 provided on the printed circuit board 26. In some cases, the cutting is done after soldering.

As described above, the cutting and the bending of terminals 17 and 18 to be conducted at the customers are performed at the lower rod section 17C/18C and the upper rod section 17D/18D whose cross sectional shape is round. Therefore, the touching to the edge of a cutting knife is mild, which remarkably reduces the wear of cutting knife. And the terminals 17/18 may be bent uniform to any specified direction. The soldering to printed circuit board 26 is conducted at the upper rod section 17D/18D, whose surface is covered with the plated layer 21/22; therefore the wetting with solder is sufficient and an enough soldering strength is assured. The terminal 17/18 is easily insertable into the hole 27 because the cross sectional shape of the guiding section, or lower rod section 17C/18C, is round.

The connecting sections 17A/18A to be buried inside the casing 11 as well as the taping sections 17B/18B remain to have a rectangle cross sectional shape, or a sheet form, therefore the insert-molding and the taping to the tape 20 are as easy as in the prior arts.

It is preferred that the cross sectional square measure at the lower rod section 17C/18C etc., whose cross section is round, is less than that at the connecting section 17A/18A etc., whose cross section is rectangle; at the same time no part of the round circumference is protruding outside the rectangle cross section. Then the terminal 17/18 may be inserted to the hole 27 smoothly. It is also preferred that the largest diameter of cross sectional rectangle at the connecting section 17A/18A is slightly larger than the inner diameter of the hole 27. Then ridge of the connecting section 17A/18A thrusts into the inner wall of hole 27 when inserted into, and a firmer fitting is assured.

It is recommended to form the lower rod section 17C/18C and the upper rod section 17D/18D through the above described method, because the method results in the plated layer 21/22 covering around the surface. However, if simply a longer life of the knife is aimed at, the rod sections may be formed by cutting or other procedures.

It is to be understood that the above described embodiment is not to be interpreted as limiting. Various alterations and modifications will no doubt become possible. For example, although in the above embodiment the cross sectional shape of the lower rod section 17C/18C and the upper rod section 17D/18D has been illustrated to be round, the rod sections may of course-take either a hexagonal, octagonal or other polygonal or an oval cross sectional shape. Namely, the wear of knife edge of a cutting device is alleviated when the rod sections take the cross sectional shape of either a round, an oval or a polygonal shape having more sides than those of a square. The most preferred shape is a round, when the knife is least worn. Although in the above embodiment a terminal having two sections whose cross section is a round shape has been exemplified, the terminal may of course be comprised of one section of round cross sectional shape, making the whole range between the connecting section 17A/18A and the taping section 17B/18B to assume a rod shape; or whenever necessary the rod shaped section may be provided for three places. The forming of terminals into a round cross sectional shape has been conducted after the original form terminals were molded into the casing 11, however the forming into a round cross sectional shape may be conducted prior to the insert-molding into the casing 11.

Accordingly, it is intended that the appended claims be interpreted as covering all alterations and modifications as fall within the true spirit and scope of the invention.

What is claimed is:

1. An electronic component terminal in the form of a terminal body comprising, a connecting section for connecting said terminal body with an electronic component, a taping section for attaching said terminal body to taping material, and at least one intermediate section in between said connecting section and said taping section, said at least one intermediate section having a cross sectional shape that differs from said connecting section and said taping section, wherein said connecting section and said taping section have a rectangular cross sectional shape, and wherein said at least one intermediate section has the cross sectional shape of either a round, an oval, or a polygon whose number of sides is more than those of a square.

2. The electronic component terminal of claim 1, wherein the different cross sectional shapes enable said taping section to be separated from said at least one intermediate section.

3. The electronic component terminal of claim 1, wherein said at least one intermediate section has a round cross sectional shape.

4. The electronic component terminal of claim 1, wherein said at least one intermediate section includes an upper section and a lower section, said terminal body further comprising a joining section that joins the upper and lower sections, wherein said joining section has a cross sectional shape that is different cross sectional shapes of said upper and lower sections, and wherein said upper section, said joining section and said lower section are in between said connecting section and said taping section.

5. The electronic component terminal of claim 1, wherein said at least one intermediate section is provided through a forming process.

6. The electronic component terminal of claim 1, wherein the surface of said terminal body is covered with a plated layer.

7. The electronic component terminal of claim 1, wherein a contact point is provided at one end of said connecting section.

8. The electronic component terminal of claim 1, wherein the surface of said terminal body is covered with a plated layer, said at least one intermediate section is disposed at a place of said terminal body where it is cut after being attached to printed circuit board and bent, and said at least one intermediate section has a round cross sectional shape.

9. The electronic component terminal of claim 2, wherein a contact point is provided at one end of said connecting section.

\* \* \* \* \*